(12) United States Patent
Jin

(10) Patent No.: US 6,884,713 B2
(45) Date of Patent: Apr. 26, 2005

(54) METHOD FOR FORMING METAL LINE OF SEMICONDUCTOR DEVICE

(75) Inventor: Won Hwa Jin, Euijeongbu-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 60 days.

(21) Appl. No.: 10/608,082

(22) Filed: Jun. 30, 2003

(65) Prior Publication Data

US 2004/0137719 A1 Jul. 15, 2004

(30) Foreign Application Priority Data

Dec. 31, 2002 (KR) .................... 10-2002-0088117

(51) Int. Cl.⁷ ......................................... H01L 21/4763
(52) U.S. Cl. .................. 438/624; 438/626; 438/631; 438/634; 438/637; 438/638
(58) Field of Search .................. 438/624, 626, 438/631, 634, 637, 638

(56) References Cited

U.S. PATENT DOCUMENTS

| | | | |
|---|---|---|---|
| 6,174,800 B1 | 1/2001 | Jang | 438/629 |
| 6,211,085 B1 | 4/2001 | Liu | 438/687 |
| 6,355,552 B1 * | 3/2002 | Gayet et al. | 438/624 |
| 6,566,241 B2 | 5/2003 | Chun | 438/618 |
| 2002/0146899 A1 | 10/2002 | Chun | 438/618 |
| 2002/0151165 A1 * | 10/2002 | Chung | 438/618 |
| 2004/0224497 A1 * | 11/2004 | Barth | 438/637 |

* cited by examiner

Primary Examiner—Olik Chaudhuri
Assistant Examiner—William M. Brewster
(74) Attorney, Agent, or Firm—Heller Ehrman White and McAuliffe LLP

(57) ABSTRACT

Methods for forming metal line of semiconductor device wherein via contact plug is formed without the deposition process of Ti/TiN liner layer and conductive layer filling a via contact hole so that the formation processes of a conductive layer for lower metal line and a conductive layer for via contact plug can be performed successively without interruption is disclosed. The method comprises the steps of: (a) sequentially forming a conductive layer for lower metal line and a conductive layer for via contact plug on a planarized first interlayer insulating film having a contact plug; (b) etching the conductive layer for via contact plug and the conductive layer for lower metal line using lower metal line mask to form a lower metal line; (c) forming a second interlayer insulating film on the entire surface; (d) etching the second interlayer insulating film and the conductive layer for via contact plug using a via contact mask to form a via contact plug; (e) forming a third interlayer insulating film on the entire surface; (f) performing a planarization process to expose a upper surface of the via contact plug; and (g) forming an upper metal line electrically connected to the via contact plug.

5 Claims, 11 Drawing Sheets

METHOD FOR FORMING METAL LINE OF SEMICONDUCTOR DEVICE

BACKGROUND OF THE INVENTION

1. Field of the Invention

The present invention generally relates to methods for forming metal line of semiconductor device, and more specifically, to methods for forming metal line of semiconductor device wherein via contact plug is formed without the deposition process of Ti/TiN liner layer and conductive layer filling a via contact hole so that the formation processes of a conductive layer for lower metal line and a conductive layer for via contact plug are performed successively without interruption to minimize the contact resistance between the lower metal line and the via contact plug, thereby simplifying the manufacturing process and improving productivity, characteristics and reliability of the device.

2. Description of the Prior Art

Generally, conductive lines of semiconductor devices used for electrical connection between devices and between a device and an external circuit is formed by filling a contact hole and via hole with conductive material and performing subsequent processes.

Metal lines are used where low resistance is required. Aluminum alloys, formed by adding silicon, copper or both of silicon and copper to aluminum, are used as materials for the metal lines for its low resistivity and excellent process characteristics.

FIGS. 1a through 1g are cross-sectional diagrams illustrating a conventional method for forming metal line of semiconductor device.

Referring to FIG. 1a, a lower metal line 11 is formed on a semiconductor substrate(not shown). The lower metal line 11 is an aluminum alloy film, and comprises Ti layers or Ti/TiN layers thereon and thereunder.

Thereafter, a planarized interlayer insulating film 13 formed on the entire surface. A photoresist film pattern 15 is then formed on the interlayer insulating film 13. The photoresist film pattern 15 is formed by exposure and development process using metal line contact mask(not shown) for forming a via contact hole.

Referring to FIG. 1b, the interlayer insulating film 13 is etched using the photoresist film pattern 15 as a mask to form a via contact hole 17 exposing the lower metal line 11. The photoresist film pattern 15 is then removed, and Ti/TiN liner layer 19, which is a bonding layer/diffusion barrier layer, is formed on the entire surface including the inner surface of the via contact hole 17.

Referring to FIG. 1c, a tungsten layer 21 filling the via contact hole 17 is formed on the entire surface.

Referring to FIG. 1d, the entire surface is planarized using the interlayer insulating film 13 as an etch stop layer to form a via contact plug 21 filling the via contact hole 17.

Referring to FIG. 1e, a conductive layer 23 for upper metal line is formed to be electrically connected to the via contact plug 21. The conductive layer 23 comprises a stacked structure of a lower Ti/TiN film, a main conductive layer for metal line, and an upper Ti/TiN film. The lower Ti/TiN film prevents the main conductive layer from reacting with the interlayer insulating film 13 which is a oxide film when the main conductive layer is an aluminum alloy or a tungsten alloy. The lower Ti/TiN film also allows uniform deposition of the aluminum alloy. The upper Ti/TiN film serves as an anti-reflective film and improves characteristics of electro-migration.

Referring to FIG. 1f, a photoresist film patter 25 is formed on the conductive layer 23. The photoresist film pattern 25 is formed by exposure and development process using an upper metal line mask(not shown).

Referring to FIG. 1g, the conductive layer 23 is etched using the photoresist film pattern 25 as a mask to form an upper metal line electrically connected to the lower metal line 11.

FIGS. 2a through 2c are SEM photographs illustrating a metal line manufactured in accordance with the conventional method.

FIG. 2a illustrates a multi-layer metal line. FIG. 2b illustrates a portion of the multi-layer metal line of FIG. 2a around the via contact plug, where seams are generated due to unstable deposition of the Ti/TiN liner film 19.

FIG. 2c illustrates the tungsten layer 21 poorly deposited on the unstable Ti/TiN liner film 19.

As described above, in the conventional method for manufacturing metal lines, seams generated during the formation process of via contact plug, poor quality tungsten film and high contact resistance degrades the characteristics of the device. Moreover, the manufacturing method is complex so that undesired impurities such as particles, which degrades the characteristics and reliability of the device.

SUMMARY OF THE INVENTION

It is an object of the present invention to provide methods for forming metal line of semiconductor device wherein via contact plug is formed without the deposition process of Ti/TiN liner layer and conductive layer filling a via contact hole so that the formation processes of a conductive layer for lower metal line and a conductive layer for via contact plug are performed successively without interruption to minimize the contact resistance between the lower metal line and the via contact plug, thereby simplifying the manufacturing process and improving productivity, characteristics and reliability of the device.

In order to achieve the above object of the present invention, there is provided a forming metal line of semiconductor device, comprising the steps of: (a) sequentially forming a conductive layer for lower metal line and a conductive layer for via contact plug on a planarized first interlayer insulating film having a contact plug; (b) etching the conductive layer for via contact plug and the conductive layer for lower metal line using lower metal line mask to form a lower metal line; (c) forming a second interlayer insulating film on the entire surface; (d) etching the second interlayer insulating film and the conductive layer for via contact plug using a via contact mask to form a via contact plug; (e) forming a third interlayer insulating film on the entire surface; (f) performing a planarization process to expose a upper surface of the via contact plug; and (g) forming an upper metal line electrically connected to the via contact plug.

DETAILED DESCRIPTION OF THE PREFERRED EMBODIMENTS

The present invention will be explained in detail referring to the accompanying drawings.

FIGS. 3a through 3i are cross-sectional diagrams illustrating a method for forming metal line of semiconductor device in accordance with the present invention.

Figure 1A:
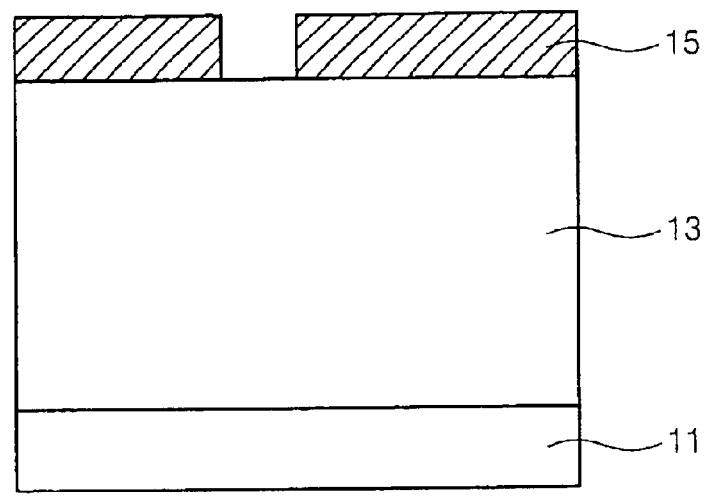
FIGS. 1a through 1g are cross-sectional diagrams illustrating a conventional method for forming metal line of semiconductor device.
Figure 1B:
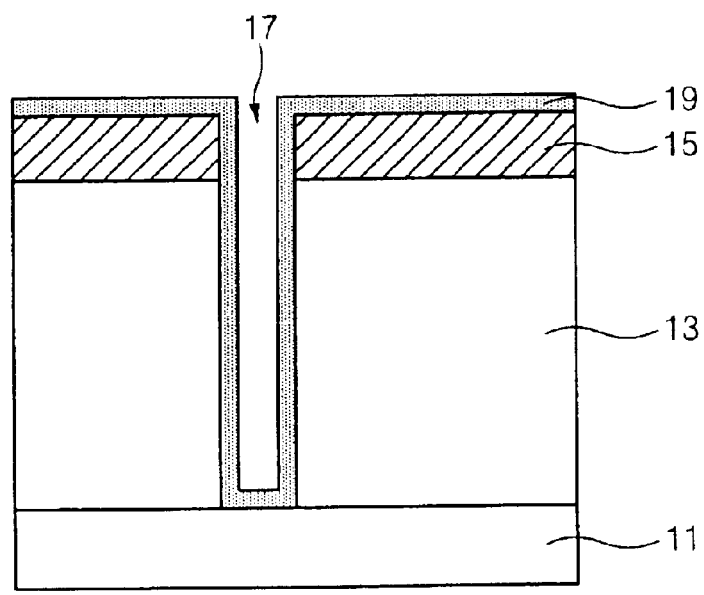
Figure 1C:
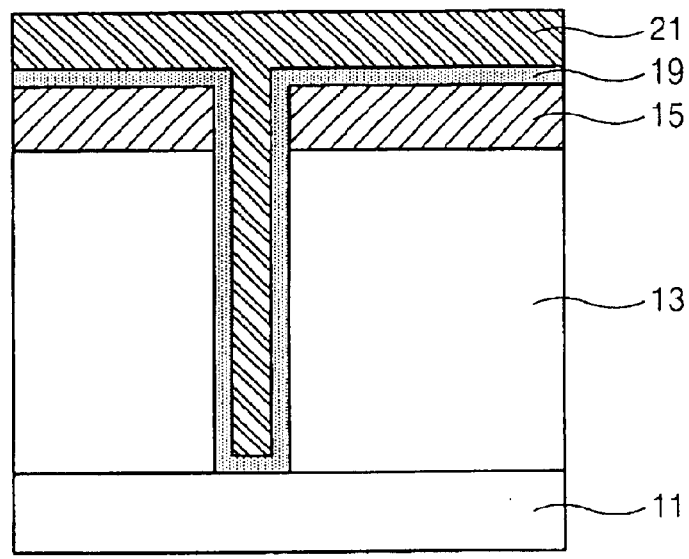
Figure 1D:
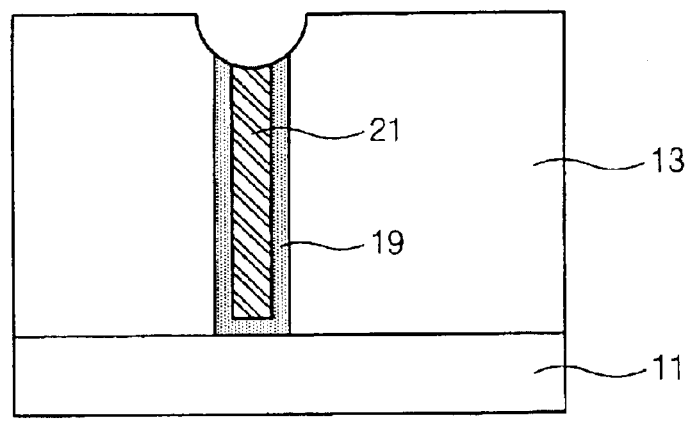
Figure 1E:
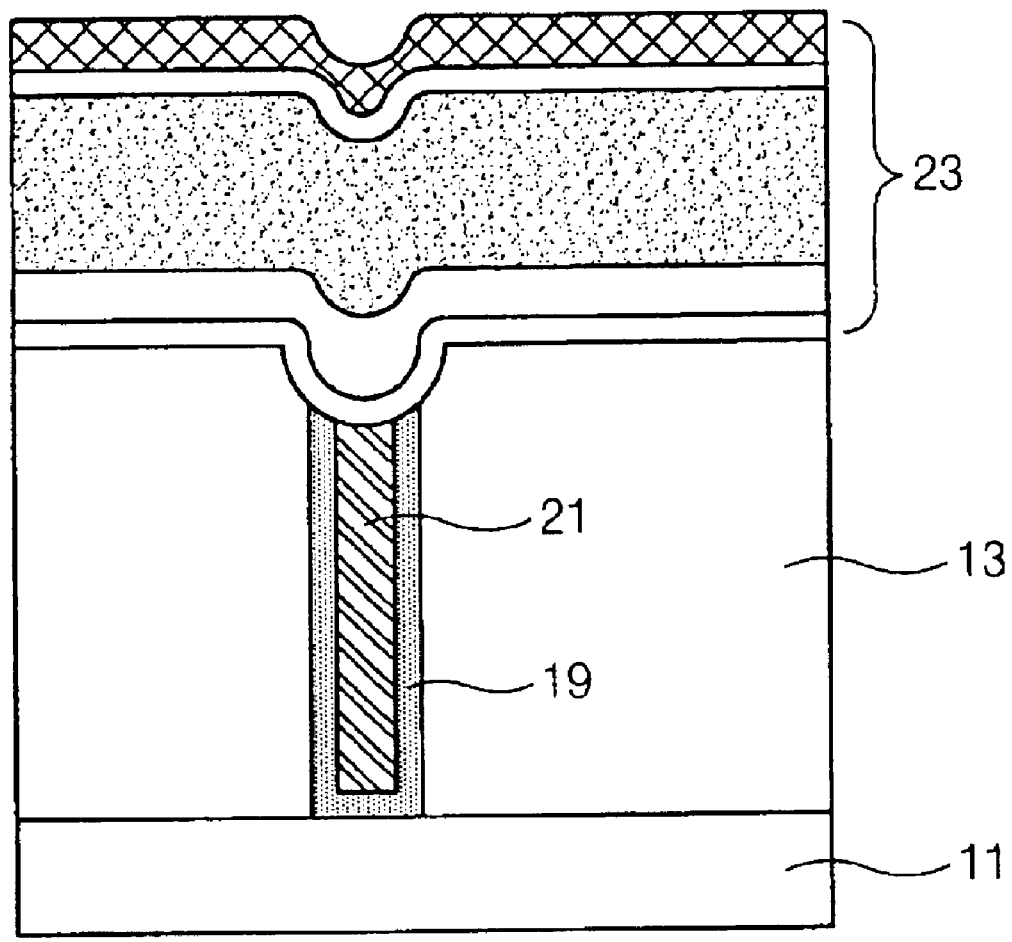
Figure 1F:
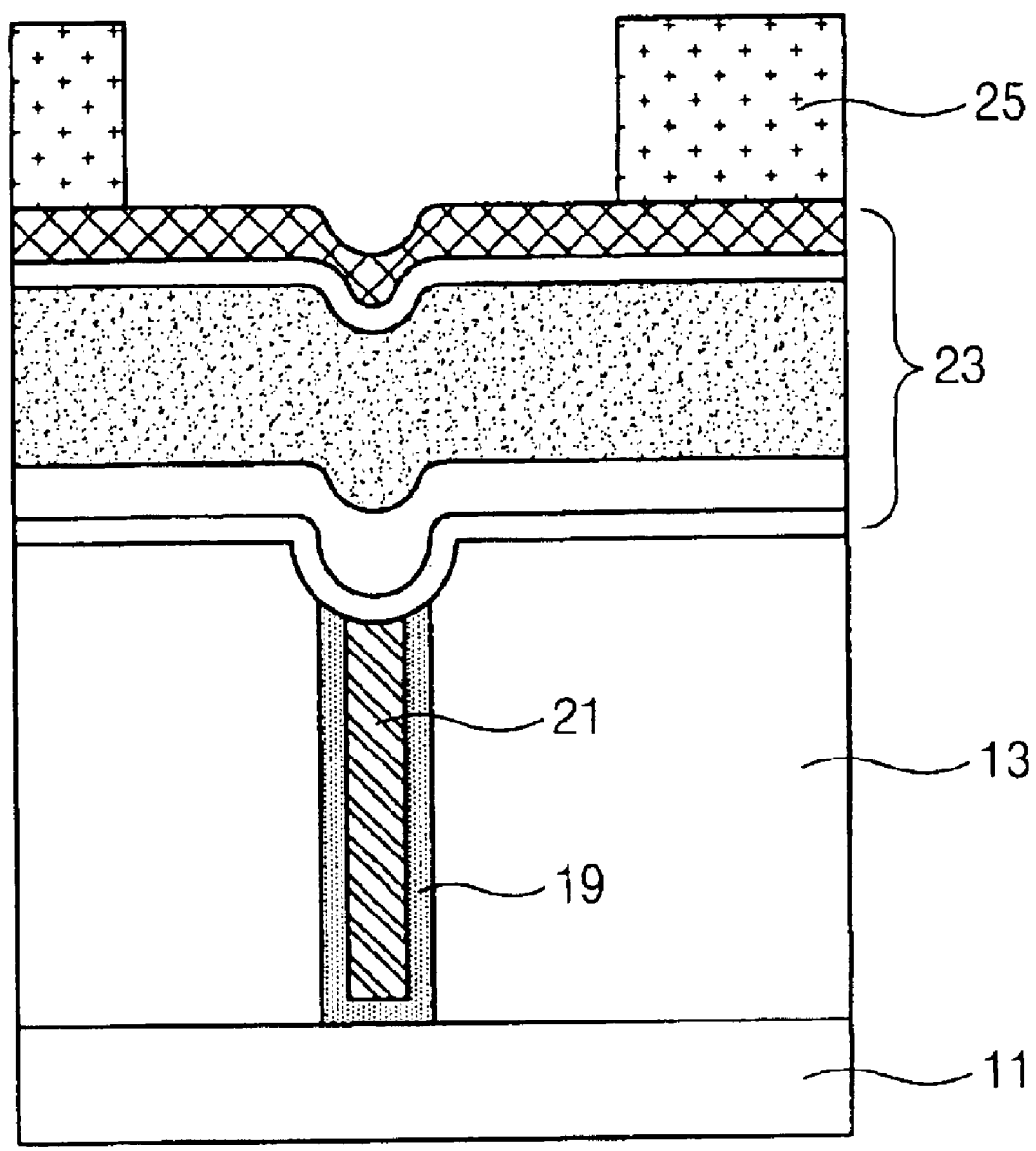
Figure 1G:
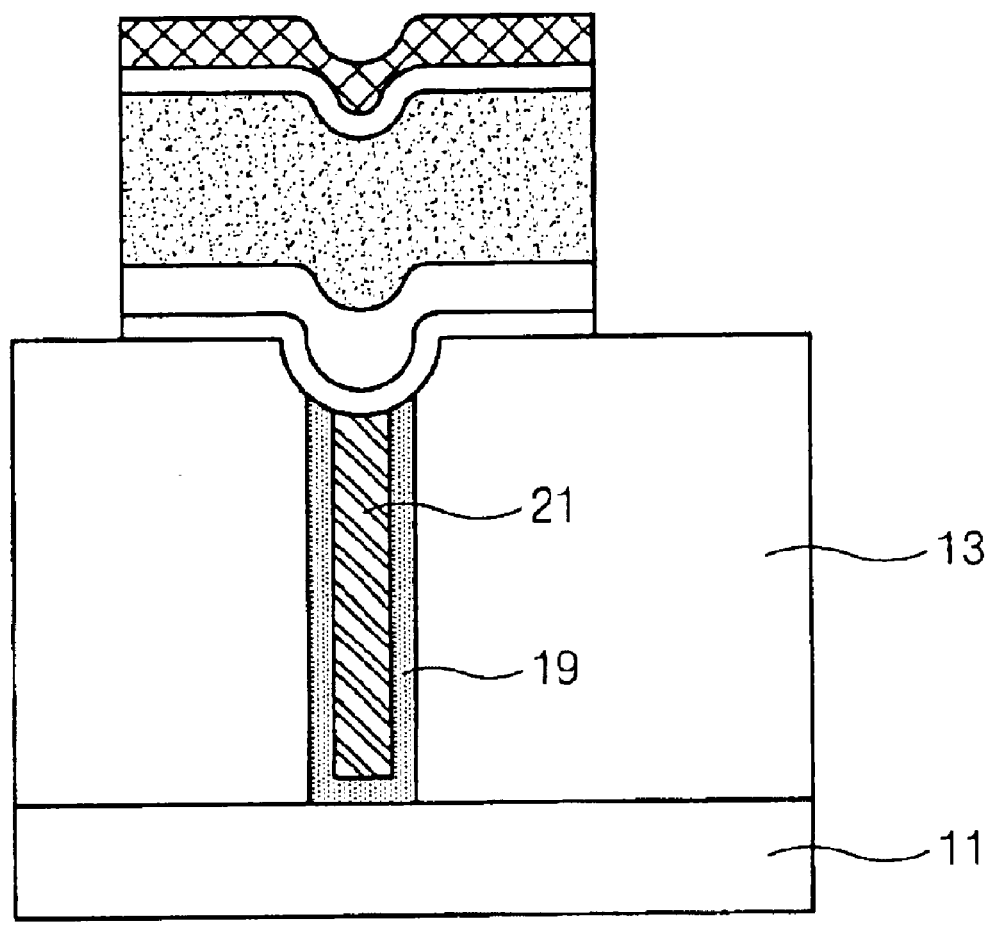
Figure 2A:
FIGS. 2a through 2c are SEM photographs illustrating a metal line manufactured in accordance with the conventional method.
Figure 2B:
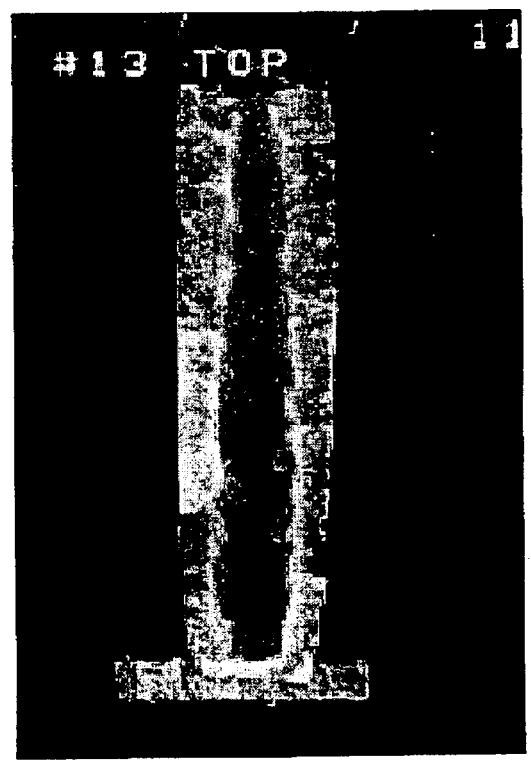
Figure 2C:
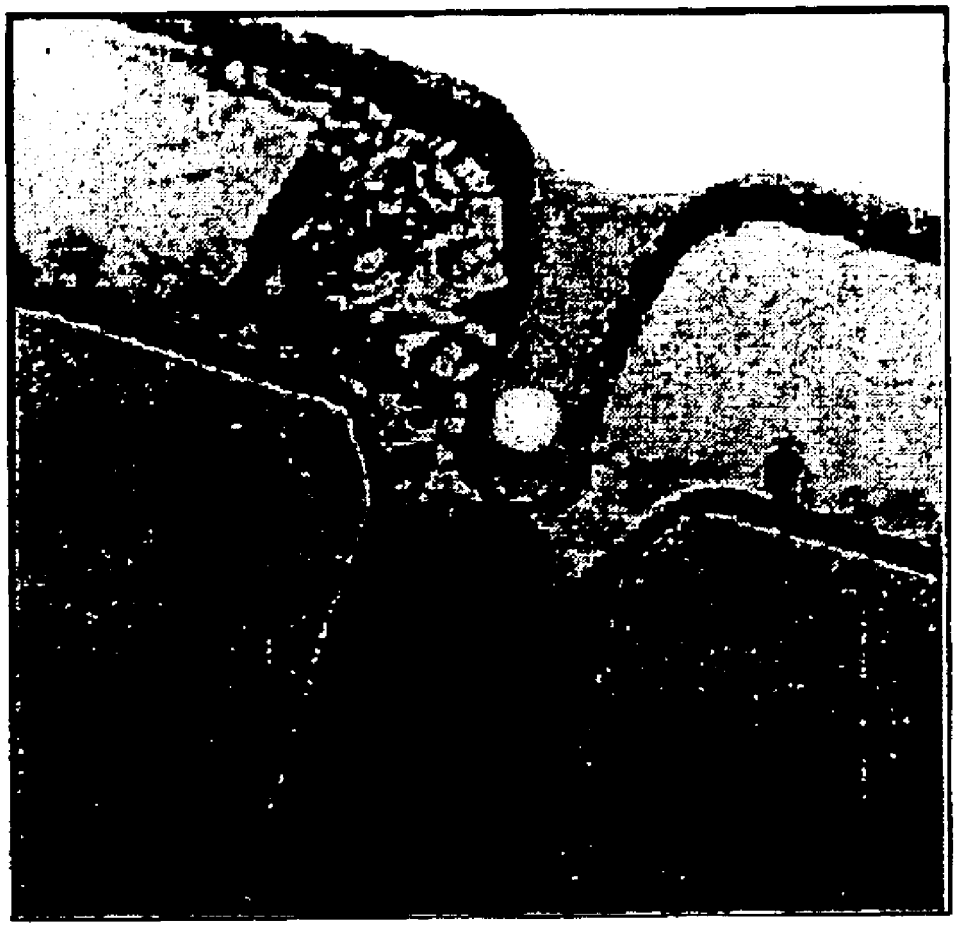
Figure 3A:
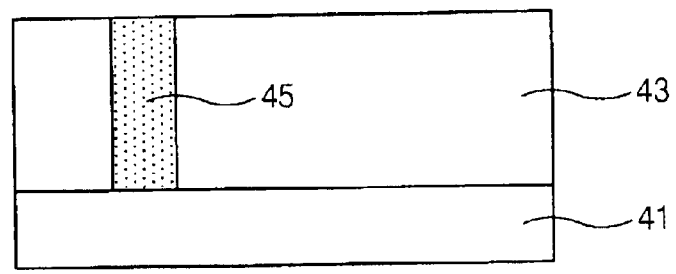
FIGS. 3a through 3i are cross-sectional diagrams illustrating method for forming metal line of semiconductor device in accordance with the present invention.

Referring to FIG. 3a, a first interlayer insulating film 43 is formed on the semiconductor substrate 41 having a device isolation film(not shown), a wordline(not shown), a bitline (not shown), and a capacitor(not shown) thereon. Thereafter, the first interlayer insulating film 43 is etched using lower metal line contact mask(not shown) to form a contact hole. The contact hole is then filled to form a contact plug 45 for lower metal line.

Figure 3B:
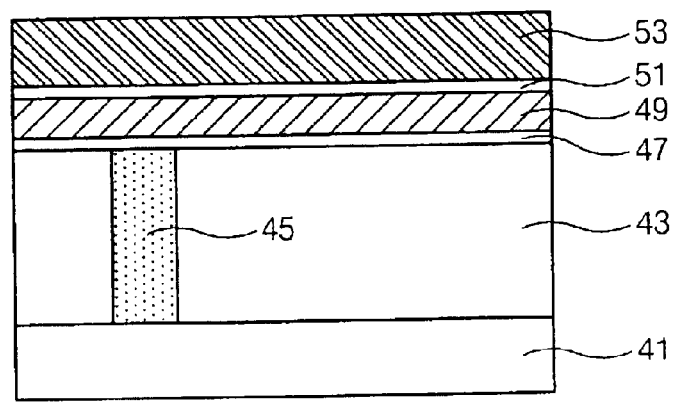

Referring to FIG. 3b, a conductive layer for lower metal line electrically connected to the contact plug 45 and a conductive layer 53 for via contact plug are sequentially formed on the entire surface. The conductive layer for lower metal line comprises a stacked structure of a first Ti/TiN layer 47, a metal layer 49 and a second Ti/TiN layer 51. Preferably, the metal layer 49 comprises aluminum, copper, tungsten, cobalt, silicon, or combinations thereof.

Preferably, The conductive layer for via contact plug comprises aluminum, copper, tungsten, cobalt, silicon, or combinations thereof. The materials for the conductive layer 53 are selected to have etch selectivity over the second Ti/TiN layer 51 so that the second Ti/TiN layer 51 serves as an etch stop film in the subsequent etch process of the conductive layer 53.

Figure 3C:
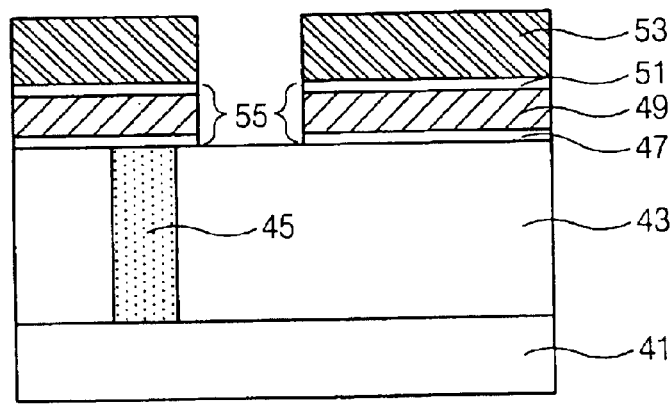

Referring to FIG. 3c, the conductive layer 53 for via contact plug and the conductive layer for lower metal line are etched using lower metal line mask(not shown), which covers a predetermined region of the conductive layer 53 where lower metal line is to be formed, to form a lower metal line 55.

Figure 3D:
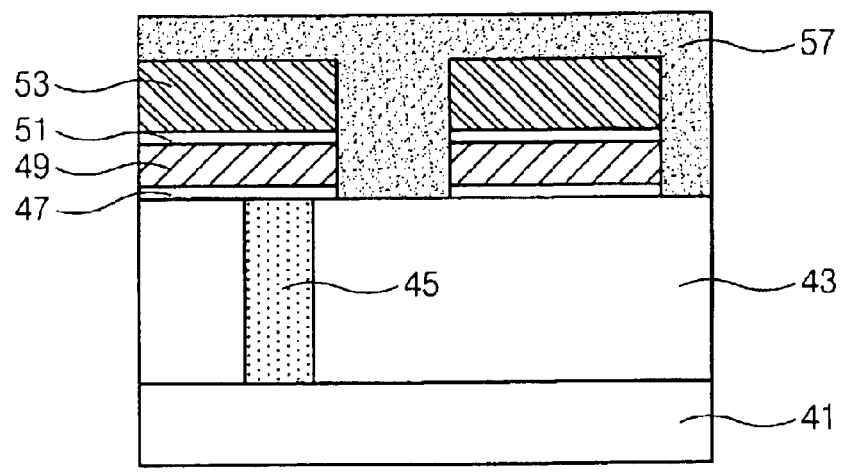

Referring to FIG. 3d, a second interlayer insulating film 57 is deposited on the entire surface.

Figure 3E:
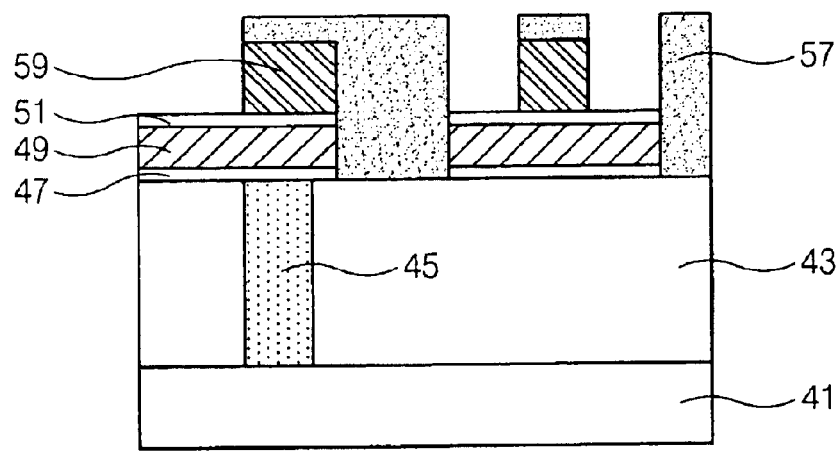

Referring to FIG. 3e, a via contact plug 59 is formed by etching the second interlayer insulating film 57 and the conductive layer 53 for via contact plug using a mask(not shown) which exposes a portion of the second interlayer insulating film above the metal line 55 except a predetermined region where the via contact plug 59 is to be formed. The via contact plug 59 can also be formed by performing a double-exposure using the lower metal line mask(not shown) and a via contact mask and then etching the double-exposed portion of the second interlayer insulating film 57 and the conductive layer 53 for via contact plug.

Figure 3F:
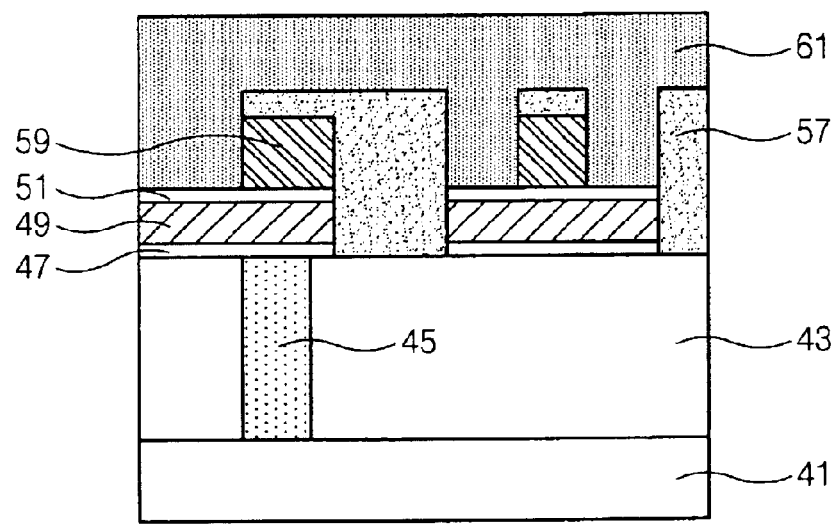

Referring to FIG. 3f, a third interlayer insulating film 61 is deposited on the entire surface.

Figure 3G:
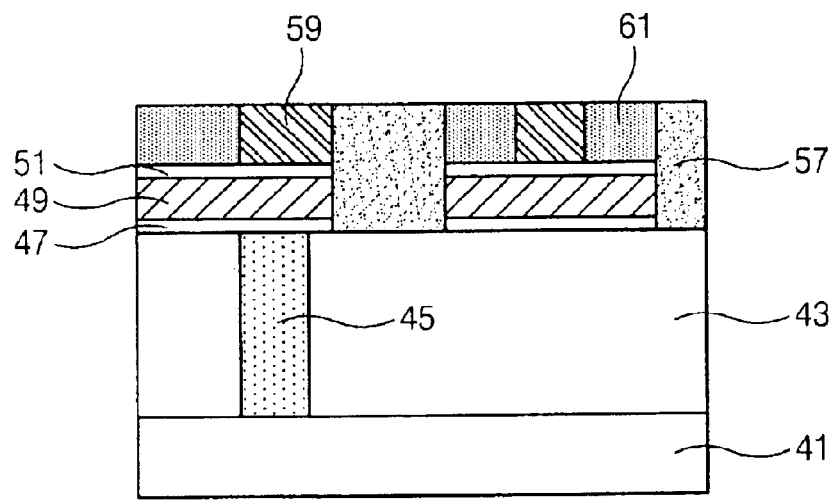

Referring to FIG. 3g, a planarization process is performed to expose a top surface of the via contact plug 59. Preferably, the planarization process is an etch-back process or a CMP(Chemical Mechanical Polishing) process.

Figure 3H:
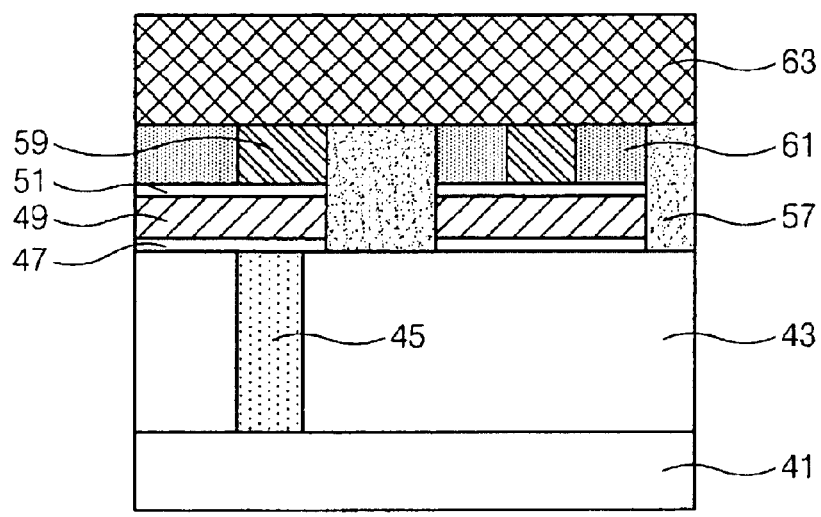

Referring to FIG. 3h, a conductive layer 63 for upper metal line electrically connected to the via contact plug 59 is formed. Preferably, the conductive layer 63 for upper metal line comprises the same materials as those of the lower metal line 55.

Figure 3I:
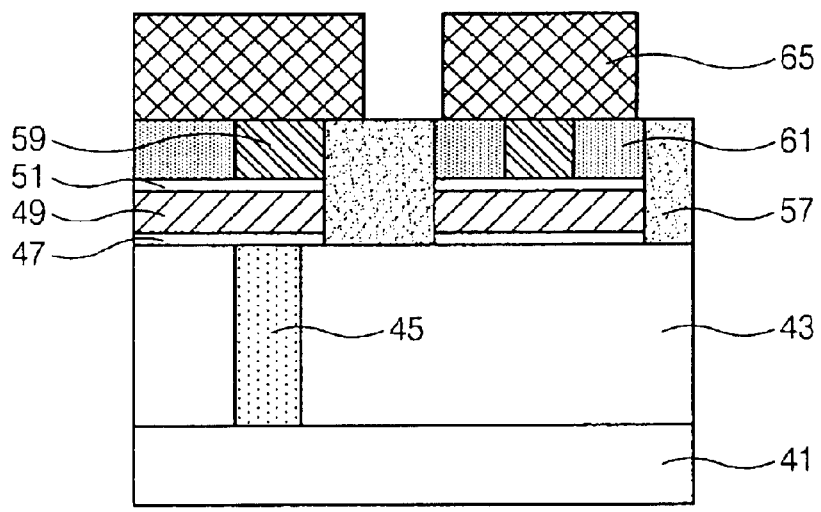

Referring to FIG. 3i, the conductive layer 63 for upper metal line is etched using upper metal line mask(not shown) to form an upper metal line 65.

The above-describe method in accordance with the present invention can be applied to formation of a metal line having a structure of three or more layers, in addition to upper and lower metal lines.

As discussed earlier, the methods in accordance with the present invention provides simplified manufacturing process and improved productivity, characteristics and reliability by forming the via contact plug without the deposition process of Ti/TiN layer and conductive layer filling a via contact hole so that the formation processes of a conductive layer for lower metal line and a conductive layer for via contact plug are performed successively without interruption to minimize the contact resistance between the lower metal line and the via contact plug.

What is claimed is:

1. A method for forming metal line of semiconductor device, comprising the steps of:

(a) sequentially forming a conductive layer for lower metal line and a conductive layer for via contact plug on a planarized first interlayer insulating film having a contact plug;

(b) etching the conductive layer for via contact plug and the conductive layer for lower metal line using a lower metal line mask to form a lower metal line;

(c) forming a second interlayer insulating film on the entire surface;

(d) etching the second interlayer insulating film and the conductive layer for via contact plug using a via contact mask to form a via contact plug;

(e) forming a third interlayer insulating film on the entire surface;

(f) performing a planarization process to expose a upper surface of the via contact plug; and (g) forming an upper metal line electrically connected to the via contact plug.

2. The method according to claim 1, wherein the conductive layer for lower metal line, the conductive layer for via contact plug and the upper metal line are respectively selected from the group consisting of aluminum layer, copper layer, tungsten layer, cobalt layer, silicon layer, and combinations thereof.

3. The method according to claim 1, wherein the via contact mask exposes a portion of the second interlayer insulating film above the lower metal line except a predetermined region where the via contact plug is to be formed.

4. The method according to claim 1, wherein the step (d) utilizes difference in etch selectivity between the conductive layer for lower metal line and the conductive layer for via contact plug.

5. The method according to claim 1, wherein the planarization process is an etch-back process or a CMP process.

* * * * *